US005835605A

United States Patent [19]

Kunimoto

[11] Patent Number: 5,835,605

[45] Date of Patent: Nov. 10, 1998

[54] ENGINE EXHAUST SOUND SYNTHESIZER

[75] Inventor: Toshifumi Kunimoto, Hamamatsu, Japan

[73] Assignee: Yamaha Corporation, Hamamatsu, Japan

[21] Appl. No.: 551,867

[22] Filed: Nov. 21, 1995

[30] Foreign Application Priority Data

Nov. 25, 1994 [JP] Japan .................................... 6-314272

[51] Int. Cl.[6] ........................................................ H03G 3/00

[52] U.S. Cl. ................................ 381/61; 381/86; 446/409

[58] Field of Search ................................. 381/61, 71, 86; 446/409, 431; 704/270, 272

[56] References Cited

U.S. PATENT DOCUMENTS

| | | | |
|---|---|---|---|
| 4,219,962 | 9/1980 | Dankman et al. | 446/409 |
| 4,946,416 | 8/1990 | Stern et al. | 446/409 |
| 5,045,016 | 9/1991 | Stern et al. | 446/409 |
| 5,047,736 | 9/1991 | Ghose | 381/71.13 |
| 5,237,617 | 8/1993 | Miller | 381/61 |
| 5,321,759 | 6/1994 | Yuan | 381/71 |
| 5,371,802 | 12/1994 | McDonald et al. | 381/71.4 |
| 5,414,230 | 5/1995 | Nieuwendijk | 381/71 |
| 5,446,790 | 8/1995 | Tanaka | 381/71 |
| 5,517,173 | 5/1996 | Cha et al. | 381/86 |
| 5,586,187 | 12/1996 | Webb | 381/61 |
| 5,635,903 | 6/1997 | Koike et al. | 381/86 |
| 5,734,726 | 3/1998 | Truchsess | 381/61 |

FOREIGN PATENT DOCUMENTS

| | | | |
|---|---|---|---|
| 4-152395 | 5/1992 | Japan | 381/61 |
| 4152395 | 5/1992 | Japan | 381/61 |
| 6289887 | 10/1994 | Japan | 381/61 |

*Primary Examiner*—Curtis A. Kuntz
*Assistant Examiner*—Xu Mei
*Attorney, Agent, or Firm*—Graham & James LLP

[57] ABSTRACT

An engine exhaust sound synthesizer is fundamentally configured by an exhaust waveform creating unit and an exhaust pipe circuit. The exhaust waveform creating unit creates an exhaust waveform signal based on accel information and engine speed information. Herein, the accel information is subjected to non-linear conversion, representing relationship between an amount of manipulation of an accel manipulator and an engine output, so that an engine output signal is produced. A plurality of exhaust waveforms are stored in advance; hence, one of them is selected based on the engine speed information and engine output signal. Then, the exhaust waveform selected is combined together with the engine output signal so that the exhaust waveform signal is created. The exhaust pipe circuit, simulating behavior of air-pressure waves propagating through pipes of an exhaust system, is designed similar to a waveguide-type circuit which is configured by delay circuits and junctions. So, the exhaust pipe circuit imparts a simulated exhaust-pipe characteristic to the exhaust waveform signal so as to produce the exhaust sound signal representing synthesized exhaust sound of an engine. By controlling the amount of manipulation of the accel manipulator, it is possible to provide realistic exhaust sound, with a high live-audio effect, whose characteristic closely follows behavior of an exhaust action of an actual engine.

9 Claims, 7 Drawing Sheets

ENGINE EXHAUST SOUND SYNTHESIZER

BACKGROUND OF THE INVENTION

1. Field of the Invention

The invention relates to engine exhaust sound synthesizers which synthesize exhaust sound of engines such as reciprocating engines.

2. Prior Art

Conventionally, engine exhaust sound synthesizers, which synthesize exhaust sound of reciprocating engines, are used for drive simulators, flight simulators, racing games and air-battle games as well as for environmental control of the interior of vehicles. One type of the engine exhaust sound synthesizer uses a waveform memory which stores waveform data, wherein the waveform data are obtained by pulse code modulation and they are made by repeating simple data. Another type of the engine exhaust sound synthesizer is designed as a musical tone synthesizer using frequency modulation.

The engine exhaust sound synthesizers conventionally known suffer from some drawbacks as follows:

It is difficult to alter waveforms of engine exhaust sound in response to accel work or running speed of a vehicle. If the synthesizers are applied to the drive simulators or games, it is difficult to obtain a sufficient live-audio effect by conventional synthesis of engine exhaust sound.

SUMMARY OF THE INVENTION

It is an object of the invention to provide an engine exhaust sound synthesizer which is capable of synthesizing engine exhaust sound with a sufficient live-audio effect.

The invention provides an engine exhaust sound synthesizer which is fundamentally configured by an exhaust waveform creating unit and an exhaust pipe circuit. The exhaust waveform creating unit creates an exhaust waveform signal based on accel information and engine speed information. Herein, the accel information is subjected to non-linear conversion, representing relationship between an amount of manipulation of an accel manipulator and an engine output, so that an engine output signal is produced. A plurality of exhaust waveforms are stored in advance; hence, one of them is selected based on the engine speed information and engine output signal. Then, the exhaust waveform selected is combined together with the engine output signal so that the exhaust waveform signal is created.

On the other hand, the exhaust pipe circuit, simulating behavior of air-pressure waves propagating through pipes of an exhaust system, is designed similar to a waveguide-type circuit which is configured by delay circuits and junctions. Herein, the delay circuit simulates an amount of delay of an air-pressure wave which propagates through a pipe, while the junction simulates scattering of air-pressure waves at a connecting section between pipes each having a different size. So, the exhaust pipe circuit imparts a simulated exhaust-pipe characteristic to the exhaust waveform signal so as to produce the exhaust sound signal representing synthesized exhaust sound of an engine.

By controlling the amount of manipulation of the accel manipulator, it is possible to provide realistic exhaust sound, with a high live-audio effect, whose characteristic closely follows behavior of an exhaust action of an engine actually provided for vehicles, air planes and the like.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Figure 1:
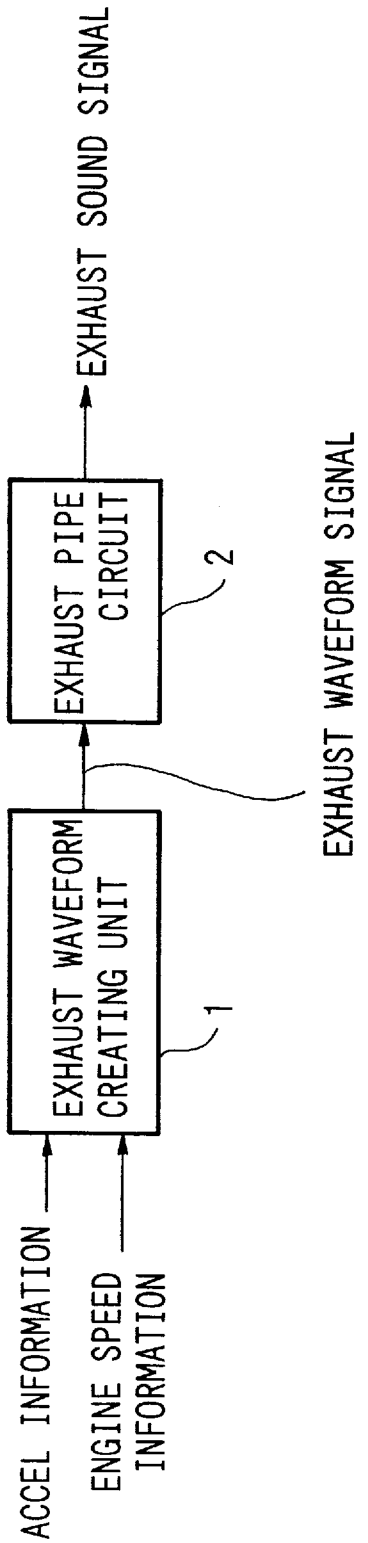
FIG. 1 is a block diagram showing a fundamental configuration of an engine exhaust sound synthesizer which is designed in accordance with an embodiment of the invention.

FIG. 1 is a block diagram showing a fundamental configuration of an engine exhaust sound synthesizer which is designed in accordance with an embodiment of the invention. In FIG. 1, an exhaust waveform creating unit 1 performs simulation for an engine model based on accel information and engine speed information (representing number of rotation of an engine, cpm), thus creating an exhaust waveform signal. An exhaust pipe circuit 2 performs simulation for a muffler or an exhaust pipe model, thus creating an exhaust sound signal based on the exhaust waveform signal.

When receiving the accel information and engine speed information, the exhaust waveform creating unit 1 creates an exhaust waveform signal based on the accel information and engine speed information. The exhaust waveform signal is supplied to the exhaust pipe circuit 2 which simulates an exhaust pipe. So, the exhaust pipe circuit 2 produces an exhaust sound signal based on the exhaust waveform signal, wherein the exhaust sound signal represents result of simulation of engine exhaust sound.

Figure 2:
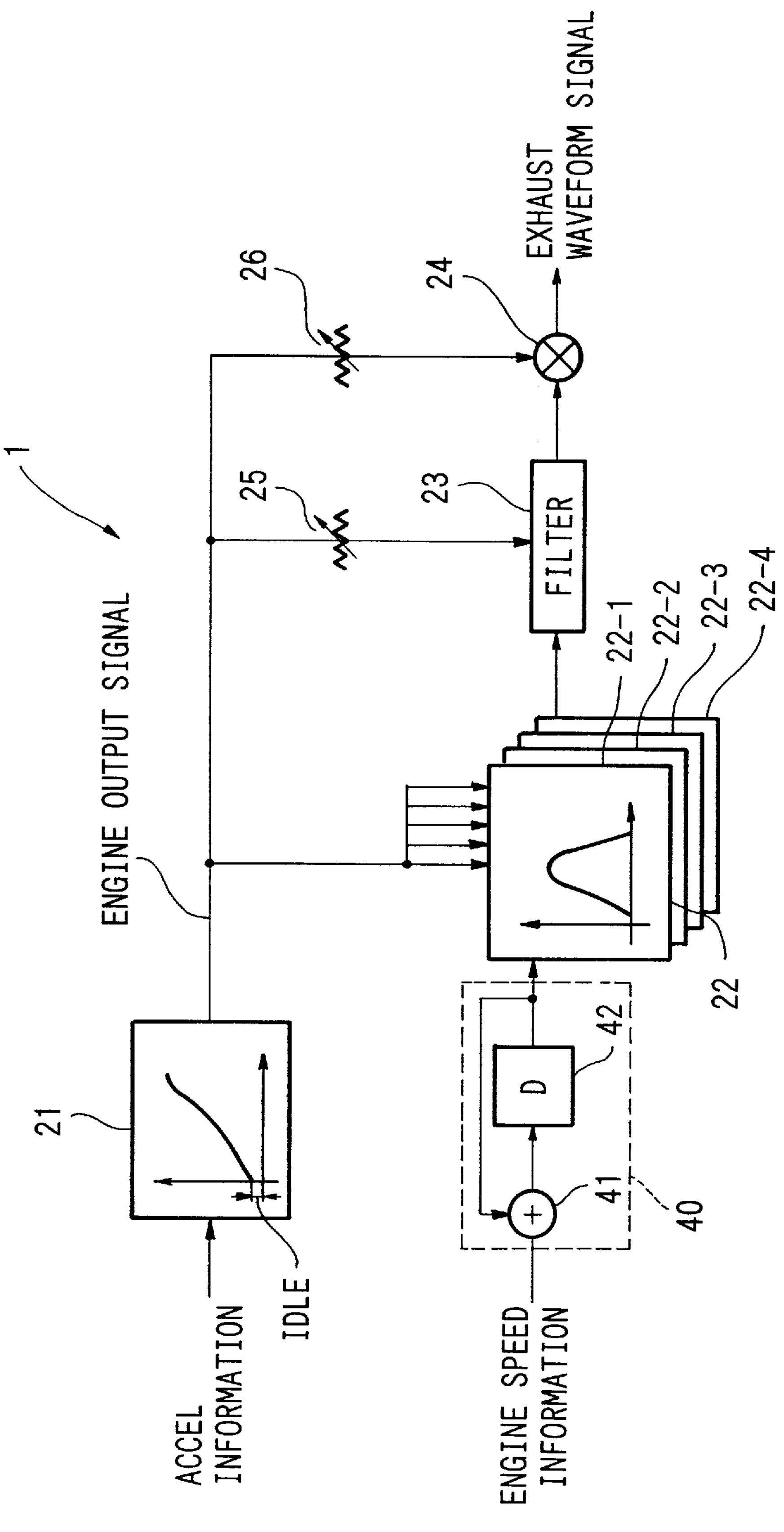
FIG. 2 is a block diagram showing an example of an exhaust waveform creating unit in FIG. 1.

FIG. 2 shows a detailed configuration of the exhaust waveform creating unit 1. This unit 1 is configured by circuit elements 21–26 and 40. Herein, a non-linear circuit 21 produces an engine output signal based on the accel information. An exhaust waveform storing unit 22 stores a variety of exhaust waveforms 22-1 to 22-4, one of which is selected in response to the engine output signal and is-outputted as an exhaust waveform signal. A filter 23 processes a tone-color factor of the exhaust waveform signal which is read out from the exhaust waveform storing unit 22. A multiplier 24 is provided to control an amplitude of the exhaust waveform signal which is supplied thereto through the filter 23. An adjuster 25 is provided to adjust an amount of process which is applied to the exhaust waveform signal by the filter 23. Another adjuster 26 is provided to adjust an amount of control which is applied to the exhaust waveform signal by the multiplier 24. A phase information creating unit 40 creates phase information by performing accumulation on engine speed information at every system-clock timing. The phase information creating unit 40 is configured by an adder 41 and a delay circuit 42 having a delay time corresponding to one system clock.

Next, operations of the exhaust waveform creating unit 1, whose configuration is shown by FIG. 2, will be described. In general, the engine output signal does not have a linear characteristic but a non-linear characteristic against digitalized accel information which is produced by a foot pedal or the like. Such a non-linear characteristic is realized by the non-linear circuit 21 which contains a table. So, when receiving the accel information, the non-linear circuit 21 produces an engine output signal which is read out from the table in response to the accel information. The engine output signal is supplied to the exhaust waveform storing unit 22; and consequently, one of the exhaust waveforms 22-1 to 22-4 is selected responsive to the engine output signal. In addition, the engine output signal is supplied to the filter 23 through the adjuster 25, so that a certain tone color, which is suited to the engine output signal, is selected for the exhaust waveform signal. Further, the engine output signal is supplied to the multiplier 24 through the adjuster 26, so that a certain amplitude, which is suited to the engine output signal, is selected for the exhaust waveform signal.

If an amount of accel information is zero, it is presumed that the engine is put in an idle state and is still running. So, even if the engine runs idle, exhaust sound may be slightly produced. In order to simulate such a slight exhaust sound, the non-linear characteristic of the non-linear circuit 21 is set in such a manner that an engine output signal is produced in small level even if the amount of accel information is zero.

The engine speed information, which is in a digital-signal form, is supplied to the adder 41 within the phase information creating unit 40. The adder 41 adds the engine speed information to an output of the delay circuit 42. Result of addition is subjected to one-system-clock delay by the delay circuit 42 and is then returned to the adder 41. Thus, the engine speed information is accumulated by every system-clock timing; and consequently, result of accumulation is outputted from the delay circuit 42. The adder 41 has a limited number of bits in its arithmetic operation; therefore, if an accumulated value overflows, a most significant bit (i.e., MSB) in an output of the adder 41 turns to '0'. Such an overflow event may occur periodically in response to an input level of the adder 41. So, the phase information creating unit 40 creates a phase-information signal having a repeat period which corresponds to level of the engine speed information.

The phase-information signal, outputted from the phase information creating unit 40, is supplied to the exhaust waveform storing unit 22 as its read address, by which one exhaust waveform is read out. Thus, an exhaust waveform signal, which is read out from the exhaust waveform storing unit 22, will have a fundamental period which corresponds to the engine speed information.

As described before, an optimum exhaust waveform is selected from among the exhaust waveforms 22-1 to 22-4 in response to level of the engine output signal which is supplied to the exhaust waveform storing unit 22. Thus, it is possible to perform simulation of engine exhaust waveform well. Further, a coefficient of the filter 23 is controlled responsive to the level of the engine output signal. Thus, it is possible to control a tone color of an exhaust-waveform signal such that the tone color is varied in response to the engine output signal. Furthermore, the multiplier 24 controls an amplitude of the exhaust waveform signal in response to the engine output signal. Thus, it is possible to control the exhaust waveform signal such that the exhaust waveform signal will have a level which is suited to the accel information.

As described above, the exhaust waveform creating unit 1 can produce an exhaust waveform signal whose waveform further approximates to an actual waveform of engine exhaust sound.

Incidentally, it is preferable to employ pulse-like waveforms or noise-like waveforms for the exhaust waveforms 22-1 to 22-4 which are stored in the exhaust waveform storing unit 22.

Moreover, the adjuster 25 is provided to manually adjust sensitivity in response of the filter 23 against the engine output signal outputted from the non-linear circuit 21. Similarly, the adjuster 26 is provided to manually adjust sensitivity in response of the multiplier 24 against the engine output signal.

Next, a detailed description will be given with respect to the exhaust pipe circuit 2 which simulates an exhaust pipe 50. In general, the exhaust pipe 50 is constructed as shown by solid lines in FIG. 3 wherein a small pipe 51 connects with a large pipe 52 which further connects with a small pipe 53. This exhaust pipe 50 can be further extended as shown by dotted lines in FIG. 3 such that the pipe 53 further connects with a set of pipes 54 to 57 in series.

Now, the exhaust pipe circuit 2, which simulates the aforementioned exhaust pipe 50, will be described with reference to FIGS. 4 to 6.

Figure 4:
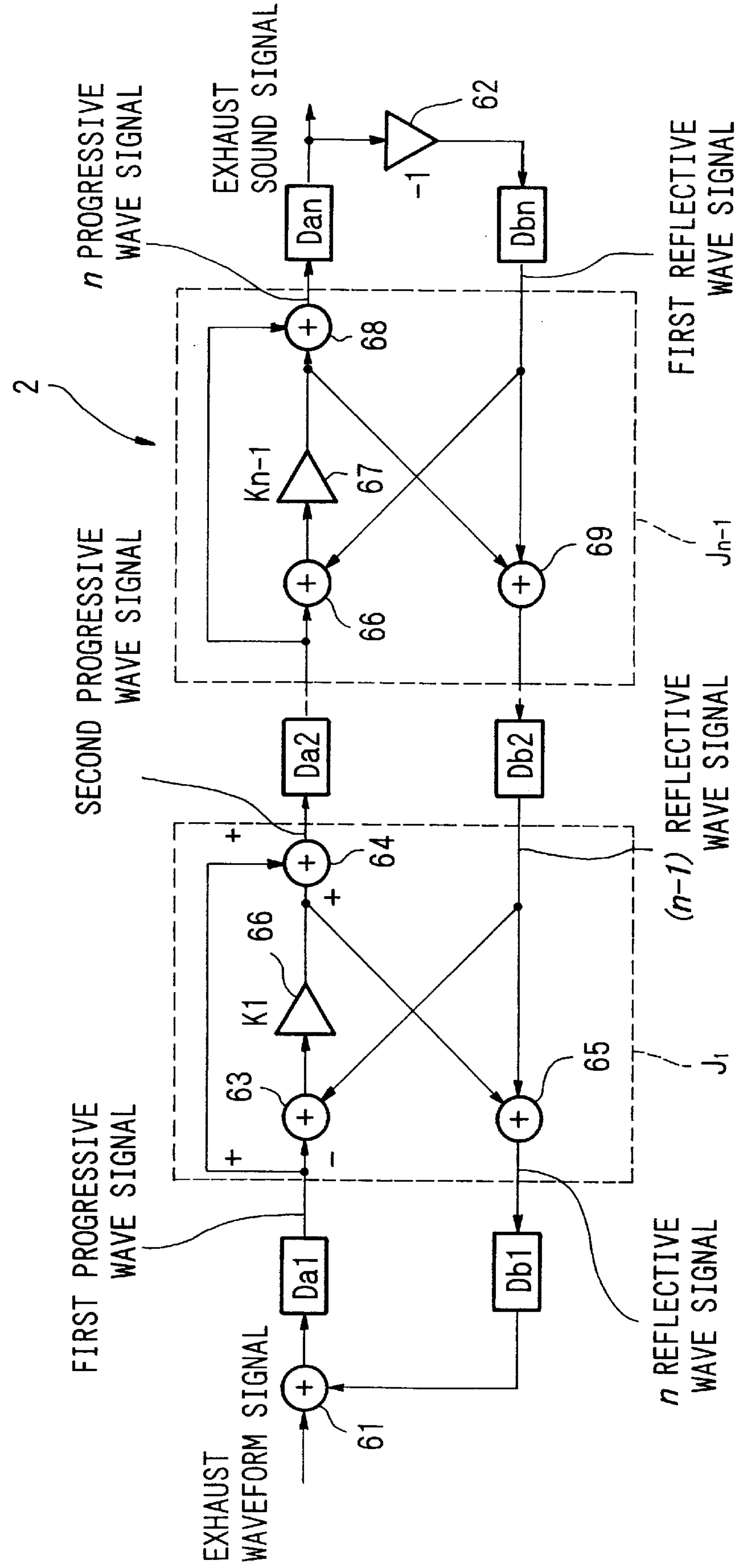
FIG. 4 is a block diagram showing an example of an exhaust pipe circuit in FIG. 1.

An example of the exhaust pipe circuit 2 is shown by FIG. 4 and is basically designed as a waveguide-type circuit. Simulation of the exhaust pipe 50 is made based on an assumption that a left end of the small pipe 51, which connects with an engine (not shown), is small in sectional area and is assumed as a closed end, while a right end of the pipe 53 or 57, from which exhaust gas is discharged to the air, is assumed as an open end.

In FIG. 4, an adder 61 is provided to simulate a phenomenon in which reflective waves of the exhaust sound are reflected by the left end of the exhaust pipe 50 and are turned to progressive waves. The adder 61 performs addition on an exhaust waveform signal and a reflective wave signal which is given from a delay circuit $Db_1$. Delay circuits $Da_1$ to $Da_n$ and delay circuits $Db_1$ to $Db_n$ simulate time by which air-pressure waves pass through the pipes 51 to 57 respectively. Delay time of each delay circuit corresponds to each of pipe lengths $D_1$ to $D_n$ shown in FIG. 3. Further, junctions $J_1$ to $J_{n-1}$ simulate connecting sections between pipes at which scattering of the air-pressure waves occurs. A coefficient multiplier 62 is provided to simulate a phenomenon that progressive waves are reversed in phase at the open end of the exhaust pipe 50 and are turned to reflective waves. The coefficient multiplier 62 multiplies an output of the delay circuit $Da_n$ by a coefficient of '−1'; and result of multiplication is supplied to the delay circuit $Db_n$.

Figure 3:
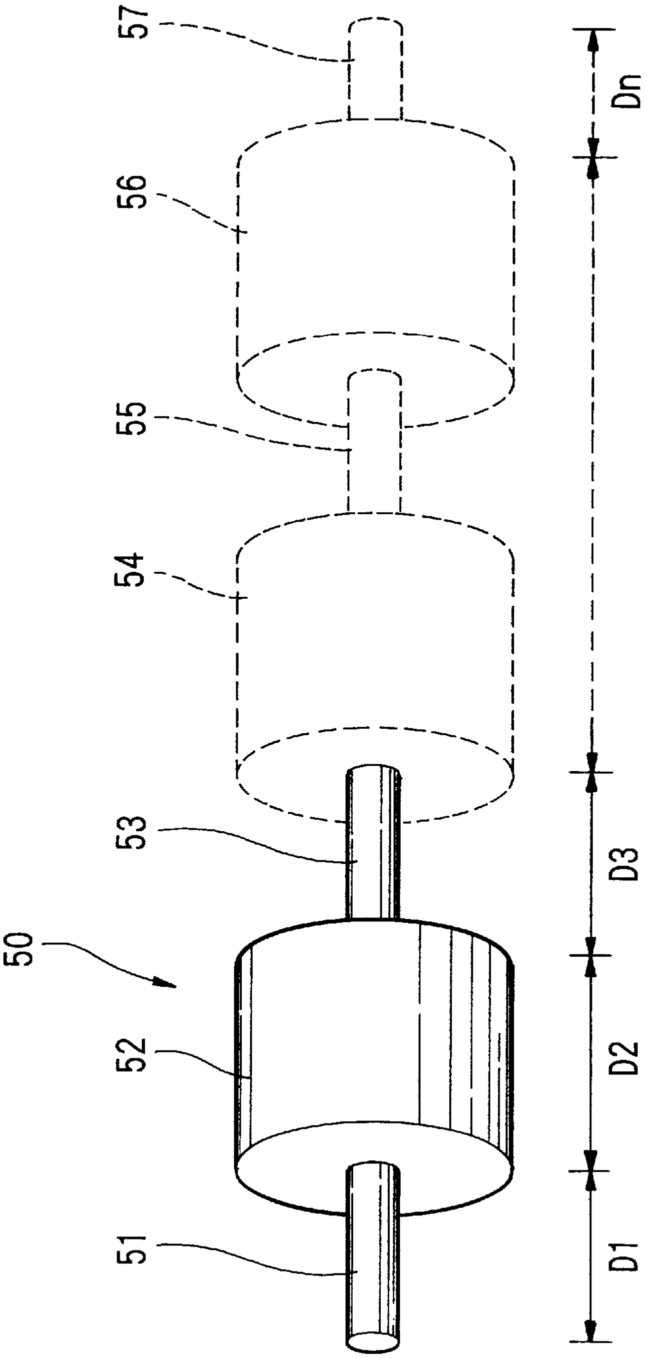
FIG. 3 is a perspective view illustrating an example of a construction of an exhaust pipe to be simulated.

If the exhaust pipe circuit 2 is designed in accordance with simulation of the exhaust pipe 50 whose construction is shown by the solid lines in FIG. 3, the exhaust pipe circuit 2 can be configured by two junctions $J_1$ and $J_2$, three pairs of delay circuits $Da_1$ to $Da_n$ and $Db_1$ to $Db_n$, one adder 61 and one coefficient multiplier 62.

The junction $J_1$ is configured by three adders 63, 64, 65 and one coefficient multiplier 66. The adder 63 subtracts a (n−1) reflective wave signal, given from the delay circuit $Db_2$, from a first progressive wave signal given from the delay circuit $Da_1$. The coefficient multiplier 66 multiplies an output of the adder 63 by a coefficient $K_1$ which corresponds to scattering characteristic at the connecting section of the exhaust pipe 50. The adder 64 adds an output of the coefficient multiplier 66 to the first progressive wave signal so as to produce a second progressive wave signal. The adder 65 adds the output of the coefficient multiplier 66 to the (n−1) reflective wave signal so as to produce a n reflective wave signal. Other junctions $J_2$ to $J_{n-1}$ have a similar configuration. The Junction $J_{n-1}$ is configured by adders 66, 68, 69 and one coefficient multiplier 67.

Next, operations of the exhaust pipe circuit 2 will be described in detail. When the exhaust waveform creating unit 1 supplies an exhaust waveform signal to the exhaust pipe circuit 2, the adder 61 adds a n reflective wave signal, given from the delay circuit $Db_1$, to the exhaust waveform signal so that a first progressive wave signal is produced and is supplied to the delay circuit $Da_1$. In the delay circuit $Da_1$, the first progressive wave signal is delayed by a certain delay time corresponding to a time lag with which an air-pressure wave propagates from a left end to a right end of the small pipe 51. Then, the first progressive wave signal is supplied to the junction $J_1$ which simulates scattering at the connecting section between the pipes 51 and 52.

In the junction $J_1$, the first progressive wave signal is delivered to the adders 63 and 64. The adder 63 subtracts a (n−1) reflective wave signal from the first progressive wave signal; and then, an output thereof is supplied to the coefficient multiplier 66. The coefficient multiplier 66 multiplies the output of the adder 63 by the coefficient $K_1$; and then, result of multiplication is delivered to the adders 64 and 65. The adder 64 adds an output of the coefficient multiplier 66 to the first progressive wave signal so as to produce a second progressive wave signal. The second progressive wave signal is supplied to the delay circuit $Da_2$ which simulates property of the large pipe 52. The adder 65 adds the (n−1) reflective wave signal, given from the delay circuit $Db_2$, to the output of the coefficient multiplier 66 so as to produce a n reflective wave signal. The n reflective wave signal is supplied to the delay circuit $Db_1$ which simulates property of the small pipe 51.

The above description relates to operations of the delay circuits $Da_1$, $Db_1$ and the junction $J_1$. Similar operations are performed by other delay circuits $Da_2$ to $Da_n$, $Db_2$ to $Db_n$ as well as the junctions $J_2$ to $J_{n-1}$. So, the junction $J_{n-1}$ produces a n progressive wave signal; and the n progressive wave signal is supplied to the delay circuit $Da_n$ which corresponds to a terminal end of the exhaust pipe 50. The delay circuit $Da_n$ delays the n progressive wave signal to produce an exhaust sound signal. The exhaust sound signal is outputted to an external device (not shown) and is also supplied to the coefficient multiplier 62. The coefficient multiplier 62 multiplies the exhaust sound signal by the coefficient of '−1' to produce a first reflective wave signal, which is then supplied to the delay circuit $Db_n$. The delay circuit $Db_n$ delays the first reflective wave signal, which is then supplied to the junction $J_{n-1}$. Such a reflective wave signal propagates from the right to the left in FIG. 4; and consequently, it is fed back to the adder 61.

Next, another examples of the junction will be described with reference to FIGS. 5A and 5B.

Figure 5A:
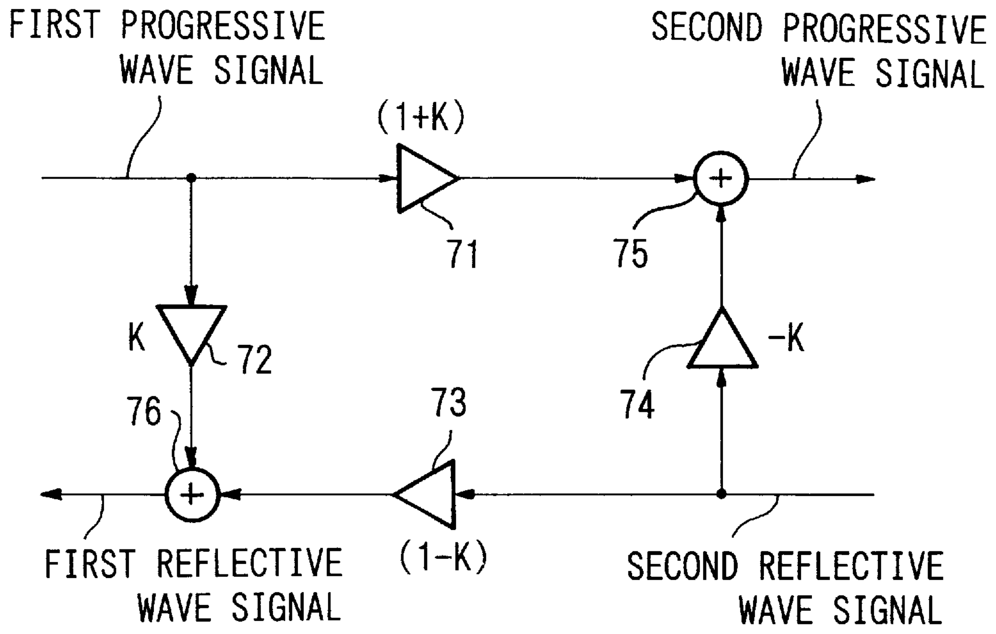
FIGS. 5A and 5B show examples of a junction which is used by the exhaust pipe circuit.

In the junction of FIG. 5A, a first progressive wave signal is delivered to coefficient multipliers 71 and 72. The coefficient multiplier 71 multiplies the first progressive wave signal by a coefficient of '1+K', while the coefficient multiplier 72 multiplies the first progressive wave signal by a coefficient of 'K'. On the other hand, a second reflective wave signal is delivered to coefficient multipliers 73 and 74. The coefficient multiplier 73 multiplies the second reflective wave signal by a coefficient of '1−K', while the coefficient multiplier 74 multiplies the second reflective wave signal by a coefficient of '−K'. An adder 75 adds an output of the coefficient multiplier 71 to an output of the coefficient multiplier 74 so as to produce a second progressive wave signal. An adder 76 adds an output of the coefficient multiplier 72 to an output of the coefficient multiplier 73 so as to produce a first reflective wave signal. Incidentally, a value of the coefficient 'K' is determined in response to scattering characteristic at the connecting section of the exhaust pipe.

Figure 5B:
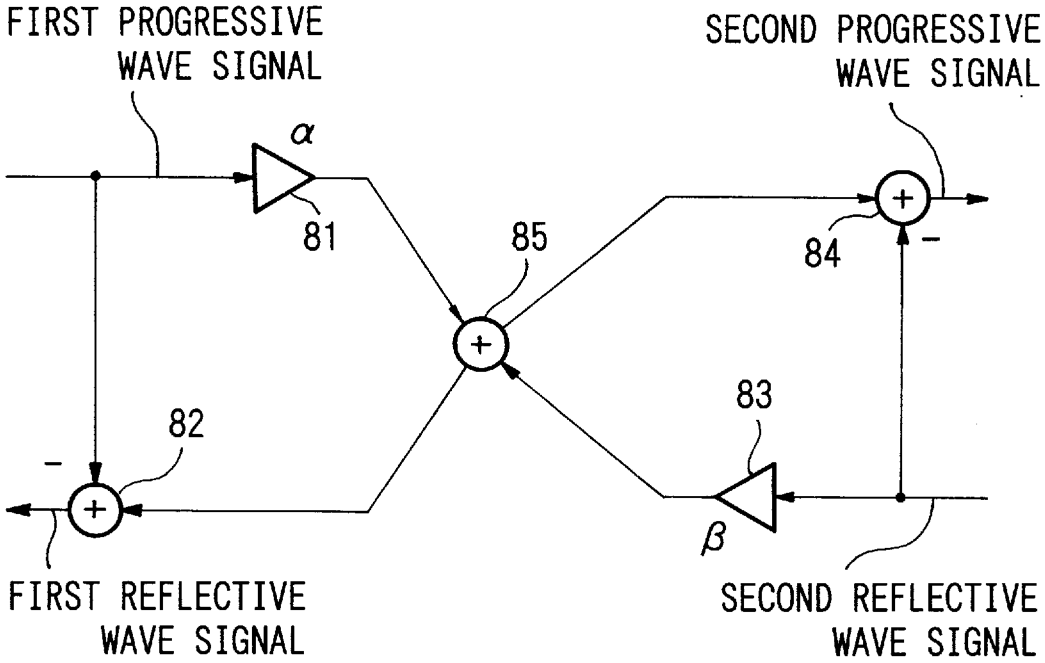

In the junction of FIG. 5B, a first progressive wave signal is delivered to a coefficient multiplier 81 and an adder 82. The coefficient multiplier 81 multiplies the first progressive wave signal by a coefficient of 'α'. On the other hand, a second reflective wave signal is delivered to a coefficient multiplier 83 and an adder 84. The coefficient multiplier 83 multiplies the second reflective wave signal by a coefficient of 'β'. An adder 85 adds an output of the coefficient multiplier 81 to an output of the coefficient multiplier 83. Then, result of addition is delivered to the adders 82 and 84. The adder 82 subtracts the first progressive wave signal from an output of the adder 85 so as to produce a first reflective wave signal. The adder 84 subtracts the second reflective wave signal from the output of the adder 85 so as to produce a second progressive wave signal. Incidentally, a value of the coefficient 'α' and a value of the coefficient 'β' are each determined in response to scattering characteristic at the connecting section of the exhaust pipe.

Like the aforementioned junctions shown in FIG. 4, the junctions of FIGS. 5A and 5B are capable of simulating the scattering of the air-pressure waves at the connecting section between pipes of the exhaust pipe.

Figure 6:
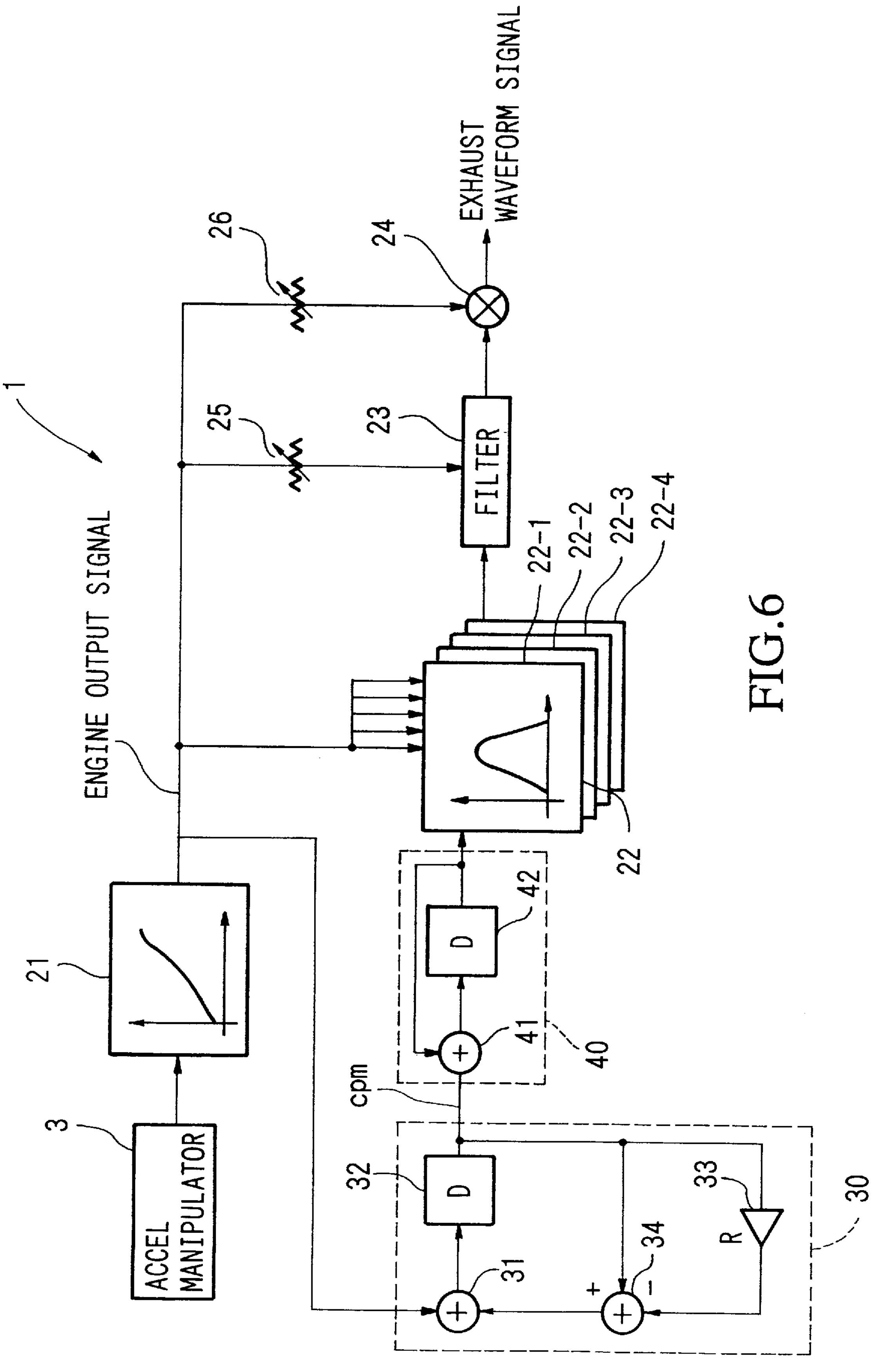
FIG. 6 is a block diagram showing another example of the exhaust waveform creating unit.

Next, another example of the exhaust waveform creating unit 1 is shown by FIG. 6. This example is designed to require inputting of accel information only. Herein, engine speed information is produced using the accel information. A structure of this example is designed close to that of an actual engine.

As compared to the aforementioned exhaust waveform creating unit of FIG. 2, the exhaust waveform creating unit of FIG. 6 additionally provides an engine speed creating unit 30. So, a detailed description will be given particularly with respect to the engine speed creating unit 30.

In FIG. 6, an accel manipulator 3 corresponds to an accel pedal, a joy stick or an engine output lever which is provided for the drive simulator, flight simulator, racing game or air-battle game. An amount of mechanical manipulation, which is applied to the accel manipulator 3, is converted into digitalized accel information by an analog-digital converting unit (not shown). So, the accel information is supplied to the non-linear circuit 21.

As described before, the non-linear circuit 21 produces an engine output signal based on an amount of manipulation of the accel manipulator 3. The engine output signal is supplied to the engine speed creating unit 30. In general, the engine speed alters responsive to variation of the engine output signal. However, variation of the engine speed is delayed behind the variation of the engine output signal. Such a relationship between the engine speed and engine output signal is simulated by the engine speed creating unit 30. The engine speed creating unit 30 is configured by an adder 31, a delay circuit 32, a coefficient multiplier 33 and an adder 34. In short, the engine speed creating unit 30 is designed as a low-pass filter.

The adder 31 adds the engine output signal to a feedback signal which is outputted from the adder 34. Then, result of addition is supplied to the delay circuit 32, from which an engine speed signal is outputted. The delay circuit 32 provides a time lag between a moment of increasing the engine output and a moment at which the engine speed is actually increased. The coefficient multiplier 33 multiplies the engine speed signal by a coefficient 'R' so as to produce an engine deceleration signal which corresponds to resistance, such as air resistance and mechanical resistance, against movement of the vehicle. The engine deceleration signal is supplied to the adder 34 as a subtraction signal by which the engine speed signal is decreased. Thus, a current engine speed signal is decreased and is then fed back to the adder 31 as the feedback signal.

Therefore, the current engine deceleration signal is subtracted from the engine speed signal; and then, result of subtraction is added to the engine output signal which corresponds to an amount of acceleration made by manipulating the accel; thus, a new engine speed signal is produced. So, if the accel manipulator 3 is manipulated, the engine speed signal is gradually increased under consideration of the resistance. As a result, the engine speed signal, created by the engine speed creating unit 30, will coincide with actual behavior of the engine.

The engine speed creating unit 30 outputs the engine speed signal (i.e., ‘cpm’) to the phase information creating unit 40. As described before, the phase information creating unit 40 creates phase information, based on the engine speed signal, by which a desired exhaust waveform is read out from the exhaust waveform storing unit 22. Then, similar operations of the exhaust waveform creating unit of FIG. 2 are performed by the exhaust waveform creating unit of FIG. 6; and consequently, an exhaust waveform signal is produced.

Figure 7:
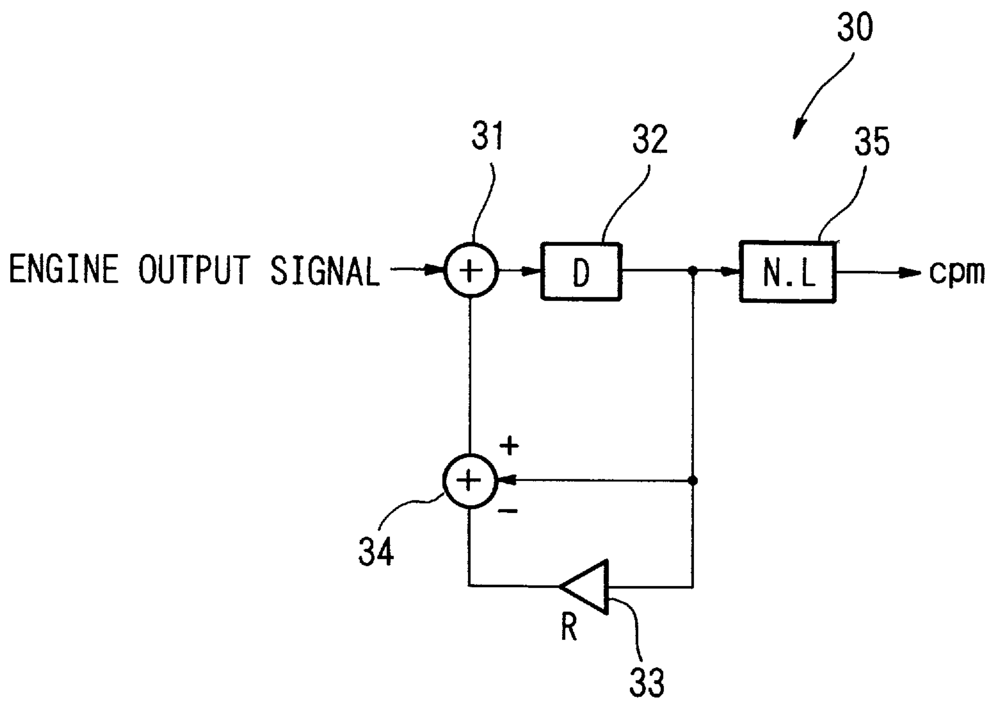
FIG. 7 is a block diagram showing an example of a configuration of an engine speed creating unit which is employed by the exhaust waveform creating unit of FIG. 6.

Normally, the engine speed signal has a non-linear characteristic against the engine output signal. In order to simulate such a non-linear characteristic, the engine speed creating unit 30 can be modified as shown by FIG. 7. In FIG. 7, a non-linear circuit 35 is newly connected to the delay circuit 32. So, an engine speed signal is outputted from the non-linear circuit 35. By providing the non-linear circuit 35, it is possible to further improve the simulation for the behavior of the engine. As a result, it is possible to synthesize engine exhaust sound with a high live-audio effect.

In FIG. 6, the accel manipulator 3 is designed responsive to the accel pedal, joy stick or engine output lever. However, it is possible to employ other kinds of manipulators such as an after-touch sensor of a keyboard or a mouse whose output continuously varies.

Incidentally, each part of the engine exhaust sound synthesizer can be configured by a hardware element; or the engine exhaust sound synthesizer can be configured using a computer, a micro processing unit (i.e., MPU) or a digital signal processor (i.e., DSP) which runs programs thereof. In addition, functions of the circuits used by the embodiment can be realized by programs which are executed by the MPU or DSP. Of course, the synthesizer can be designed as a hybrid system which adequately combines the above elements.

If the engine exhaust sound synthesizer is applied to the computer game or drive simulator, it is possible to change the accel information and engine speed information in response to movement of images on a screen or in response to progress of the game.

Further, it is possible to adequately change exhaust waveforms, stored by the exhaust waveform storing unit 22, filter characteristic of the filter 23, coefficients and characteristics of the exhaust pipe circuit 2, non-linear characteristic of the non-linear circuit 21 and characteristic of the engine speed creating unit 30 on the basis of objective in usage of the games; or it is possible to modify the present embodiment such that those characteristics can be set variable.

The invention can provide sophisticated simulation by reflecting information, regarding load of engine, states of traveling paths in games, states of steering, operations of clutches and brakes to the engine speed signal, filter characteristic and amplitude of the exhaust waveform signal.

If the invention is applied to simulation of an air-plane engine in the flight simulator, each element of the engine exhaust sound synthesizer is controlled responsive to states of flight and states of flight control.

Amounts of delay, which are set for the exhaust pipe circuit 2, can be changed responsive to variation in temperature of the engine and exhaust pipe. Such a variation of temperature can be calculated using the engine speed as well as time of rotation of the engine. Thus, it is possible to perform simulation under consideration of expansion and contraction of an exhaust system (i.e., exhaust pipe) due to the heat or variation of sound speed due to the heat. In that simulation, it is possible to change the exhaust waveform in response to the variation of temperature.

Moreover, if a noise generator is employed by the invention, it is possible to control frequency characteristic and amplitude of the exhaust waveform signal in response to the amount of manipulation of the accel and the engine speed. Normally, engine noise frequently occurs at an ignition timing of the engine. So, in order to initiate generation of noise at the ignition timing, timings of generating the noise are controlled responsive to read-out phase values of the exhaust waveform signal. For example, it is possible to insert noise to an attack portion of the exhaust waveform signal; or it is possible to increase amplitude of the noise at the attack portion of the exhaust waveform signal.

The present embodiment describes that the exhaust waveform is read out from a waveform memory (i.e., the exhaust waveform storing unit 22). However, the invention is not limited to the embodiment. So, the invention can employ any types of techniques which are capable of generating a desired waveform; in other words, the invention can employ any types of waveform generation methods or waveform synthesis methods. For example, it is possible to employ a method in which FM waves or PCM pulse waves are filtered by some filters.

The present embodiment can be further modified to perform simulation on an exhaust system having two exhaust pipes, wherein the simulation can provide a stereophonic effect in the exhaust sound. Such a simulation can be realized by extracting a part of a signal, provided at a certain middle point of the exhaust pipe circuit 2, as the exhaust sound signal.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. An engine exhaust sound synthesizer comprising:

signal generating means, having a characteristic of simulating an engine output, for generating an engine output signal in response to an amount of manipulation applied to an accel manipulator;

engine speed creating means for creating an engine speed signal by at least delaying the engine output signal;

waveform generating means for generating an exhaust waveform signal in response to the engine speed signal provided by the engine speed creating means; and an exhaust pipe circuit for simulating an exhaust pipe, wherein the exhaust waveform signal generated by the exhaust waveform generating means comprises a digital signal and is supplied to the exhaust pipe circuit, from which a sound signal corresponding to the synthesized engine exhaust sound is output, and wherein the exhaust pipe circuit has a closed-loop configuration containing a delay for the digital signal.

2. An engine exhaust sound synthesizer according to claim 1 further comprising conversion means, having a non-linear characteristic, which converts the amount of manipulation of the accel manipulator into its corresponding engine output signal.

3. An engine exhaust sound synthesizer according to claim 1 wherein the engine speed creating means creates the engine speed signal by performing filter process on the engine output signal.

4. An engine exhaust sound synthesizer according to claim 1 wherein the delay loop, provided in the exhaust pipe circuit, has an amount of delay which corresponds to a length of an exhaust pipe to be simulated.

5. An engine exhaust sound synthesizer according to claim 1 wherein the waveform generating means contains waveform storing means for storing waveform data corresponding to a specific exhaust waveform, so that the exhaust waveform signal is generated by reading out the waveform data from the waveform storing means.

6. An engine exhaust sound synthesizer according to claim 5 wherein the waveform generating means further contains phase creating means which creates a phase signal based on the engine speed signal, so that the waveform data are read out from the waveform storing means in response to the phase signal.

7. An engine exhaust sound synthesizer comprising:

exhaust waveform creating means for creating an exhaust waveform signal based on digitalized accel information and engine speed information; and an exhaust pipe circuit, simulating sound-propagation characteristics of an exhaust pipe, for producing an exhaust sound signal based on the exhaust waveform signal, which comprises a digital signal, and wherein the exhaust sound signal represents a synthesized exhaust sound.

8. An engine exhaust sound synthesizer according to claim 7 wherein the exhaust waveform creating means contains a non-linear circuit and exhaust waveform storing means; the non-linear circuit performs non-linear conversion, representing relationship between an amount of manipulation of an accel and an engine output, on the accel information so as to produce an engine output signal; the exhaust waveform storing means stores a plurality of exhaust waveforms, one of which is selected based on the engine output signal and the engine speed information, so that the exhaust waveform selected is combined together with the engine output signal so as to form the exhaust waveform signal.

9. An engine exhaust sound synthesizer comprising:

exhaust waveform creating means for creating an exhaust waveform signal based on accel information and engine speed information; and an exhaust pipe circuit, simulating sound-propagation characteristics of an exhaust pipe, for producing an exhaust sound signal based on the exhaust waveform signal, wherein the exhaust sound signal represents a synthesized exhaust sound, and wherein the exhaust pipe circuit is designed as a waveguide circuit configured by delay circuits and junctions; the delay circuit simulates an amount of delay of an air-pressure wave which propagates though a pipe provided in the exhaust pipe; the junction simulates scattering between air-pressure waves at a connecting section between pipes, each having a different size, in the exhaust pipe.

* * * * *